United States Patent
Tan et al.

(10) Patent No.: US 9,525,436 B2
(45) Date of Patent: Dec. 20, 2016

(54) DATA DETECTOR WITH EXTENDED STATES

(71) Applicant: Avago Technologies General IP (Singapore) Pte. Ltd., Singapore (SG)

(72) Inventors: Weijun Tan, Longmont, CO (US); Bruce A. Wilson, San Jose, CA (US); Kelly K. Fitzpatrick, Sudbury, MA (US); Seongwook Jeong, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 78 days.

(21) Appl. No.: 14/583,077

(22) Filed: Dec. 24, 2014

(65) Prior Publication Data

US 2016/0191083 A1    Jun. 30, 2016

(51) Int. Cl.
| | |
|---|---|
| H03M 13/03 | (2006.01) |
| H03M 13/39 | (2006.01) |
| G06F 11/10 | (2006.01) |
| H03M 13/29 | (2006.01) |
| H03M 13/00 | (2006.01) |
| H03M 13/41 | (2006.01) |

(52) U.S. Cl.
CPC ...... *H03M 13/3961* (2013.01); *G06F 11/1076* (2013.01); *H03M 13/2957* (2013.01); *H03M 13/6331* (2013.01); *H03M 13/4138* (2013.01)

(58) Field of Classification Search
CPC ............. H03M 13/3961; H03M 13/256; G06F 11/1076
See application file for complete search history.

(56) References Cited

U.S. PATENT DOCUMENTS

| | | | |
|---|---|---|---|
| 6,212,661 B1 * | 4/2001 | Rub | G11B 20/10009 714/769 |
| 9,124,299 B1 * | 9/2015 | Bellorado | H03M 13/42 |
| 2004/0091039 A1 * | 5/2004 | Xia | H04L 1/0054 375/233 |
| 2013/0064332 A1 | 3/2013 | Chen | |
| 2014/0240863 A1 | 8/2014 | Parthasarathy | |

OTHER PUBLICATIONS

Petrovic, "List Viterbi Decoding with Continuous Error Detection for Magnetic Recording", IEEE 0-7803-7206-9/01 2001.

* cited by examiner

*Primary Examiner* — Sam Rizk

(57) ABSTRACT

A data detector includes a branch metric calculator operable to calculate branch metrics for transitions between states in a trellis for the data detector, and a pruning circuit operable to prune prohibited states from the trellis. The states in the trellis comprise basic states and extended states, where the extended states have a greater number of bits than the basic states.

20 Claims, 4 Drawing Sheets

DATA DETECTOR WITH EXTENDED STATES

FIELD OF THE INVENTION

The field relates to signal processing, and, more particularly, to processing of digital data signals.

BACKGROUND

Various products including hard disk drives utilize a read channel device to retrieve information from a medium and decode and convert the information to a digital data format. Such read channel devices may include data processing circuits including encoder, detector and decoder circuits to encode, detect and decode data as it is stored and retrieved from a medium or transmitted through a data channel, in order to reduce the likelihood of errors in the retrieved data.

It is important that the read channel devices be able to rapidly and accurately detect the data bits in retrieved or received data samples so they can be decoded. A number of various types of detectors are available to identify the value of encoded data bits as they are retrieved or received, before the detected data is decoded. Some such detectors determine the most likely value of each encoded data bit using a trellis structure to calculate the probability or branch metric for each possible value of a bit or group of bits.

Because efforts are continually being made to increase the speed of data processing circuits while reducing their size and complexity, all while operating with increasingly dense storage devices or transmission channels that increase noise, there exists a need in the art for improving data detection in data processing circuits.

SUMMARY

Various embodiments of the present invention provide apparatuses, systems and methods for data detection in a detector with an extended-state trellis. In some embodiments, a data detector includes a branch metric calculator operable to calculate branch metrics for transitions between states in a trellis for the data detector, and a pruning circuit operable to prune prohibited states from the trellis. The states in the trellis comprise basic states and extended states, where the extended states have a greater number of bits than the basic states.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Figure 1:
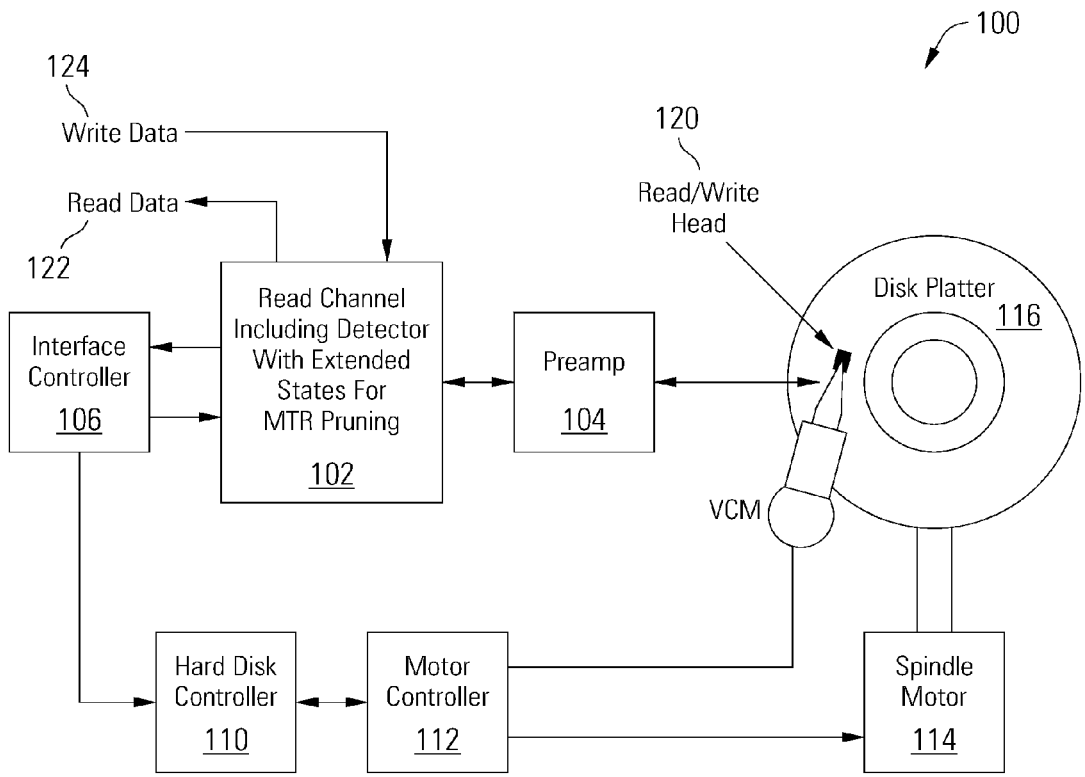
FIG. 1 depicts a storage system including a data detector with extended states in accordance with one or more embodiments of the present invention.

In some embodiments, extra states, referred to herein as extended states, are included in the data value decision trellis of the data detector. Such extended states are based on more data bits than other states in the trellis. The extended states enable pruning of the trellis to be performed based on constraints applied to the input data, such as, but not limited to, run length limiting and maximum transition run. It is assumed that the input data to the data detector has been encoded according to these constraints, prohibiting particular patterns in the input data that would violate the constraints. The use of extended states in the trellis enables the detector to prune decision paths or branches through the trellis that would violate constraints on the input data, while primarily using less complex states in the trellis that are too short to identify prohibited patterns in the input data. Thus, by including some extended states along with the less complex states in the trellis, the detector achieves nearly the same detection performance with fewer overall states, significantly reducing the power consumption and area of the detector. For example, in some embodiments, a 10-state detector with extended states can achieve the performance of a 16-state detector. The extra states can be merged on the fly for a time varying constraint to save power.

Any suitable data detector can be adapted to implement the extended states as disclosed herein, such as, but not limited to, a Soft Output Viterbi Algorithm (SOVA) detector, or a maximum a posteriori probability (MAP) detector, another trellis-based detector or some combination of SOVA, MAP and/or other detector types.

Embodiments of the invention will be illustrated herein in conjunction with exemplary disk-based storage devices, read channel circuitry and associated signal processing circuitry for processing read channel data signals. For example, embodiments of the invention include hard disk drives or other types of storage devices that exhibit enhanced signal processing by using a data detector with extended states. It should be understood, however, that these and other embodiments of the invention are more generally applicable to any storage device in which improved signal processing is desired. Additional embodiments may be implemented using components other than those specifically shown and described in conjunction with the illustrative embodiments. Data detection using extended states is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Turning to FIG. 1, a storage system 100 is illustrated as an example application of a data processing system with a data detector with extended states in accordance with some embodiments of the present invention. The storage system 100 includes a read channel circuit 102 with a data detector with extended states. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 decodes and digitizes the received analog signal to recreate the information originally written to disk platter 116. This data is provided as read data 122 to a receiving circuit. While processing the read data, read channel circuit 102 processes the received signal using a data detector with extended states. A write operation is substantially the opposite of the preceding read operation with write data 124 being provided to read channel circuit 102. This data is then encoded and written to disk platter 116.

In addition, it should be noted that storage system 100 may be modified to include solid state memory that is used to store data in addition to the storage offered by disk platter 116. This solid state memory may be used in parallel to disk platter 116 to provide additional storage. In such a case, the solid state memory receives and provides information directly to read channel circuit 102. Alternatively, the solid state memory may be used as a cache where it offers faster access time than that offered by disk platter 116. In such a case, the solid state memory may be disposed between interface controller 106 and read channel circuit 102 where it operates as a pass-through to disk platter 116 when requested data is not available in the solid state memory or when the solid state memory does not have sufficient storage to hold a newly written data set. Based upon the disclosure provided herein, one of ordinary skill in the art will recognize a variety of storage systems including both disk platter 116 and a solid state memory.

Figure 2:
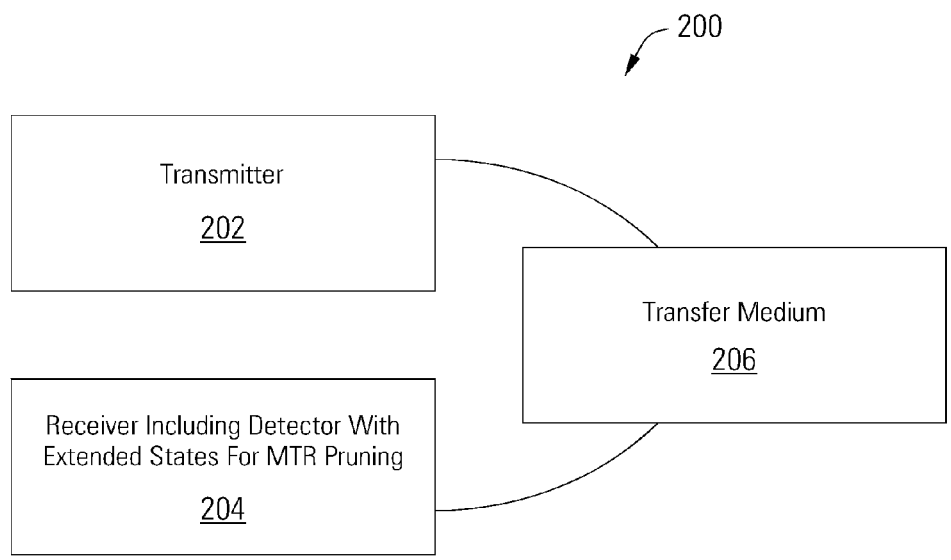
FIG. 2 depicts a wireless communication system including a data detector with extended states in accordance with one or more embodiments of the present invention.

Turning to FIG. 2, a wireless communication system 200 or data transmission device including a receiver 204 with a data detector with extended states is shown in accordance with some embodiments of the present invention. The transmitter 202 is operable to transmit encoded information via a transfer medium 206 as is known in the art. The encoded data is received from transfer medium 206 by receiver 204. Receiver 204 processes the received data, including detecting the bit values of the received data using the data detector with extended states.

Figure 3:
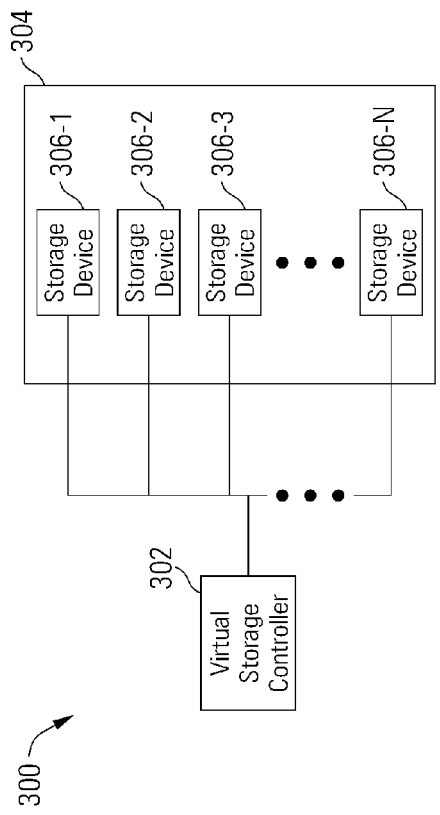
FIG. 3 depicts a virtual storage system incorporating a plurality of disk-based storage devices of the type shown in FIG. 1, according to an embodiment of the invention.

Multiple storage devices 306-1 through 306-N possibly of various different types may be incorporated into a virtual storage system 300 as illustrated in FIG. 3. The virtual storage system 300, also referred to as a storage virtualization system, illustratively comprises a virtual storage controller 302 coupled to a RAID system 304, where RAID denotes Redundant Array of Independent storage Devices. The RAID system more specifically comprises N distinct storage devices denoted 306-1, 306-2, . . . 306-N, one or more of which may be hard disk drives and one or more of which may be solid state drives. Furthermore, one or more of the hard disk drives of the RAID system are assumed to be configured to include read channel circuitry and associated signal processing circuitry as disclosed herein. These and other virtual storage systems comprising hard disk drives or other storage devices are considered embodiments of the invention.

Figure 4:
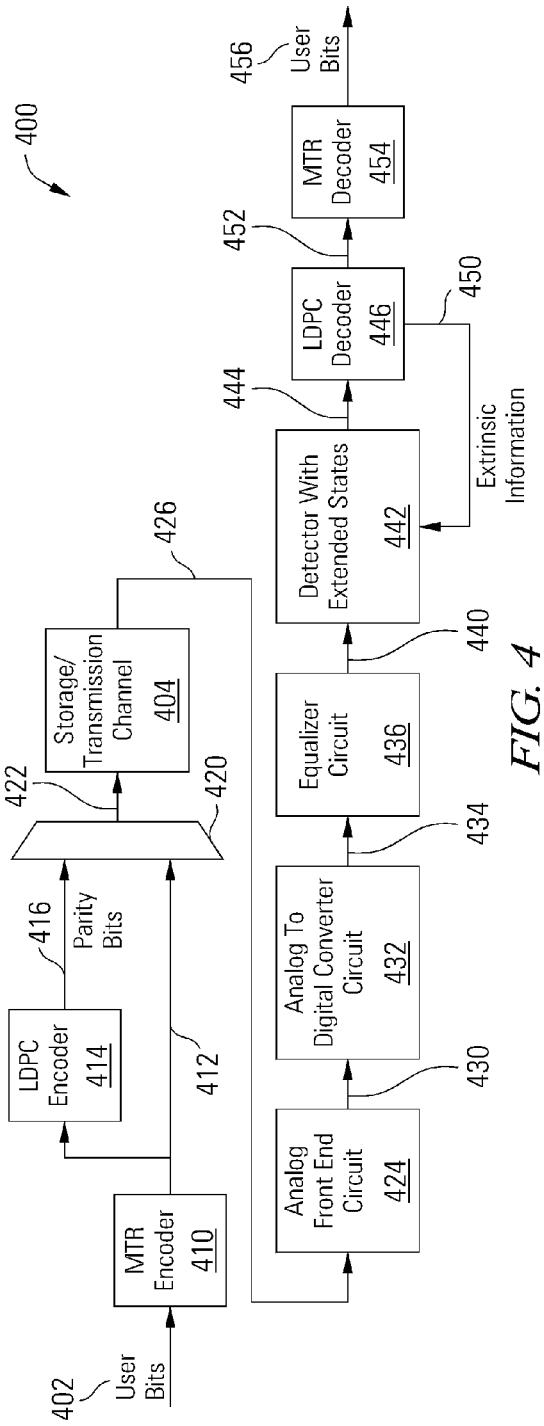
FIG. 4 depicts a block diagram of a read channel with a data detector with extended states in accordance with various embodiments of the present invention.

Turning now to FIG. 4, a read channel 400 is depicted including a data detector 442 with extended states in accordance with some embodiments of the present invention. The read channel 400 is used to process user data bits 402, store them in or transit them through a storage or transmission channel 404 and retrieve the user data bits 406 without introducing errors. In the example embodiment of FIG. 4, the user data bits 402 are processed in a maximum transition run (MTR) encoder 410, an enumerative encoder which limits the maximum transition run length in the encoded user bits 412. The frequency response of the read channel 400 is generally at a maximum at DC and degrades near the Nyquist frequency, particularly when the storage or transmission channel 404 is a magnetic storage device. By limiting the maximum transition run length in the encoded user bits 412, the read channel 400 operates below the Nyquist frequency and avoids errors that might be introduced by the degraded frequency response near the Nyquist frequency.

The encoded user bits 412 are provided to a low density parity check (LDPC) encoder 414, which produces parity bits 416 for the encoded user bits 412. The parity bits 416 are combined with the encoded user bits 412 in a multiplexer 420. The resulting digital data stream 422 can be further manipulated as desired before storage or transmission in storage or transmission channel 404. For example, the digital data stream 422 may be converted to analog format and modulated or otherwise processed before it used to drive a magnetic write head or to be transmitted as a radio frequency signal or other wired or wireless signal.

The read channel 400 includes an analog front end circuit 424 that receives and processes an analog signal 426 from the storage or transmission channel 404. Analog front end circuit 424 may include, but is not limited to, an analog filter and an amplifier circuit as are known in the art. Based upon the disclosure provided herein, one of ordinary skill in the art will recognize a variety of circuitry that may be included as part of analog front end circuit 424. In some cases, the gain of a variable gain amplifier included as part of analog front circuit 424 may be modifiable, and the cutoff frequency and boost of an analog filter included in analog front end circuit 424 may be modifiable. Analog front end circuit 424 receives and processes the analog signal 426, and provides a processed analog signal 430 to an analog to digital converter circuit 432. In some cases, analog signal 426 is derived from a read/write head assembly in the storage or transmission channel 404 that is disposed in relation to a storage medium. In other cases, analog signal 426 is derived from a receiver circuit in the storage or transmission channel 404 that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog input 426 may be derived.

Analog to digital converter circuit 432 converts processed analog signal 430 into a corresponding series of digital samples 434. Analog to digital converter circuit 430 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 434 are provided to an equalizer circuit 436. Equalizer circuit 436 applies an equalization algorithm to digital samples 434 to yield an equalized output 440. In some embodiments of the present invention, equalizer circuit 436 is a digital finite impulse response filter circuit as are known in the art. Equalized output 440 is provided to a data detector circuit 442. In some cases, equalizer 436 includes sufficient memory to maintain one or more codewords until a data detector circuit 442 with extended states is available for processing.

The data detector circuit 442 performs a data detection process on the received input from the storage or transmission channel 404 resulting in a detected output 444. Again, the data detector circuit 442 includes extended states, enabling the data detector circuit 442 to prune edges between states in the trellis that are prohibited by the constraints applied in the MTR encoder 410. However, the data detector circuit 442 primarily uses less complex states in the trellis, based on fewer data bits, reducing the overall number of states and the size and power consumption of the detector 442 while the extended states examine longer bit sequences based on the sequence length of data patterns prohibited by the constraints.

The detected output 444 is provided to a decoder such as an LDPC decoder 446 which performs parity checks on the detected output 444, ensuring that parity constraints established by the LDPC encoder 414 are satisfied in order to detect and correct any errors that may have occurred in the data while passing through the storage or transmission channel 404 or other components of the read channel 400. Other error detection and correction encoders and decoders may be used in the read channel 400 in place of the LDPC encoder 414 and LDPC decoder 446, and one of ordinary skill in the art will recognize a variety of error detection and correction encoders and decoders that may be used in relation to different embodiments of the present invention. In the case of the LDPC encoder 414 and LDPC decoder 446, the data detector circuit 442 and LDPC decoder 446 may operate in an iterative fashion, with extrinsic information 450 passed from the LDPC decoder 446 to the data detector circuit 442 to aid in the data detection and parity check process. The LDPC decoder 446 yields encoded user bits 452 retrieved from the storage or transmission channel 404, with the parity bits removed after the combination of encoded user bits and parity bits satisfy the parity check constraints.

The encoded user bits 452 from the LDPC decoder 446 are provided to an MTR decoder 454 which reverses the enumerative encoding performed by the MTR encoder 410. The MTR decoder 454 yields user data bits 456, which should be identical to user data bits 402 if the data is not corrupted in the storage or transmission channel 404 beyond the capacity of the data detector circuit 442 and LDPC decoder 446 to correct.

In some embodiments of the present invention, data detector circuit 442 is a Viterbi algorithm data detector circuit as are known in the art. In other embodiments of the present invention, data detector circuit 442 is a maximum a posteriori data detector circuit as are known in the art. Of note, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 442 is started based upon availability of a data set from equalizer circuit 436 or other source. Data detector circuit 442 is operable to apply a data detection algorithm to a received codeword or data set made up of a sequence of data bits, and in some cases data detector circuit 442 can process two or more codewords in parallel.

Figure 5:
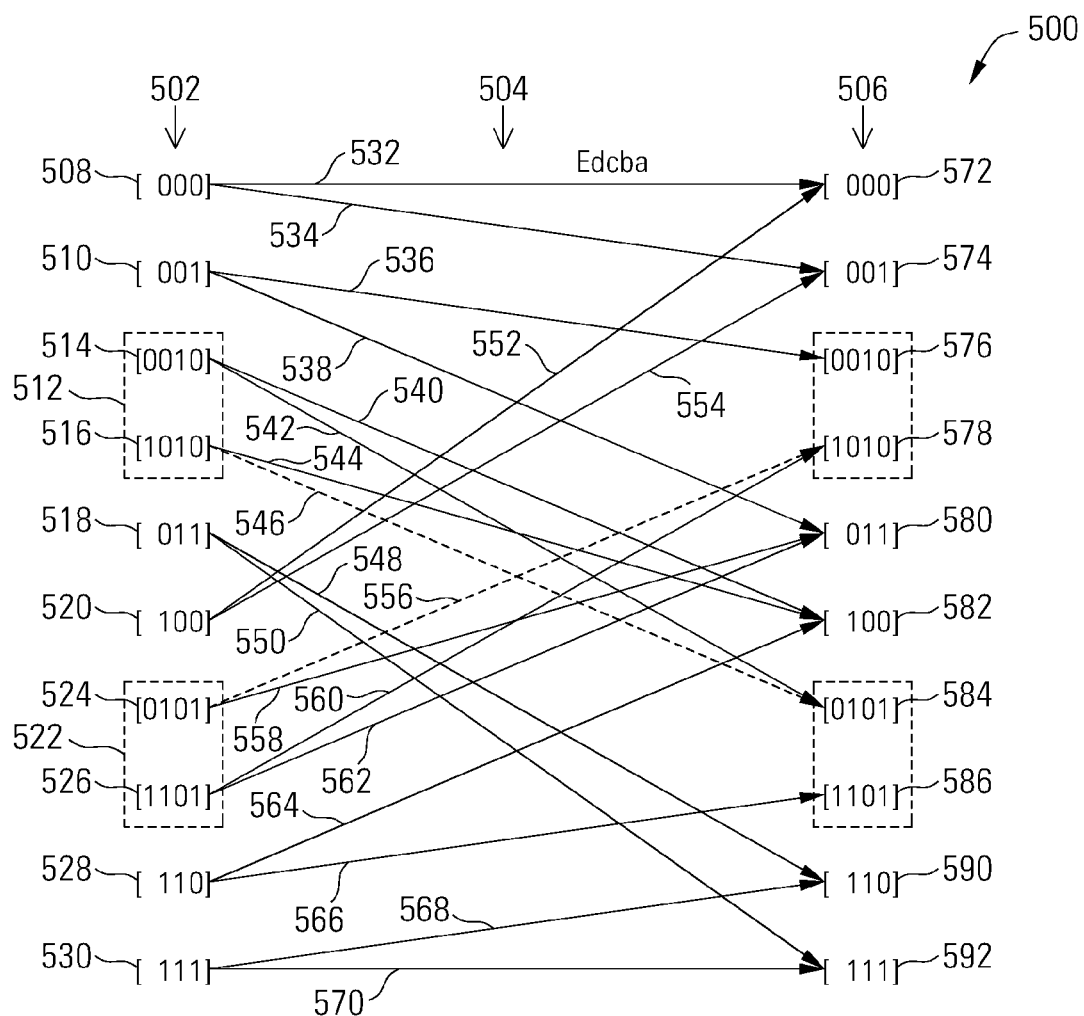
FIG. 5 depicts a trellis with branches between two bit positions for a 10-state detector with extended states in accordance with various embodiments of the present invention.

Turning to FIG. 5, a trellis diagram 500 with branches between two bit positions for a 10-state detector with extended states is depicted in accordance with various embodiments of the present invention. States at time k 502 correspond to different possible values of a group of bits, with basic states 508, 510, 518, 520, 528, 530 having bits [dcb] and extended states 514, 516, 524, 526 having bits [Edcb], where bit E is an extended bit, older than bit d, and where bit b is the newest bit. States at time k+1 506 correspond to different possible values of an overlapping group of bits, with basic states 572, 574, 580, 582, 590, 592 having bits [cba] and extended states 576, 578, 584, 586 having bits [dcba], where bit a is the newest bit and bit d is the oldest bit. Between time k and time k+1, bit a is received and is added to the right-most end of the value, and the left-most bit from time k 502 dropping off. Bit d drops off from basic states 508, 510, 518, 520, 528, 530 and bit E drops off from extended states 514, 516, 524, 526.

Transitions 504 between states at time k 502 and states at time k+1 504 represent the possible paths between states at time k 502 and states at time k+1 504. For example, state 508 has two possible transitions 532 and 534. If a '0' bit is received, taking transition path 532, state 508 is followed by state 572, still with value [000]. If a '1' bit is received, taking transition path 534, state 508 is followed by state 574 with value [001]. State 510 [001] takes transition 536 to state 576 [0010] if a '0' bit is received, or transition 538 to state 580 [011] if a '1' bit is received. Extended state 514 [0010] takes transition 540 to state 582 [100] if a '0' bit is received, or transition 542 to extended state 584 [0101] if a '1' bit is received. Extended state 515 [1010] takes transition 544 to state 582 [100] if a '0' bit is received, or transition 546 to extended state 584 [0101] if a '1' bit is received. State 518 [011] takes transition 548 to state 590 [110] if a '0' bit is received, or transition 550 to state 592 [111] if a '1' bit is received. State 520 [100] takes transition 552 to state 572 [000] if a '0' bit is received, or transition 554 to state 574 [001] if a '1' bit is received. Extended state 524 [0101] takes transition 556 to extended state 578 [1010] if a '0' bit is received, or transition 558 to state 580 [011] if a '1' bit is received. Extended state 526 [1101] takes transition 560 to extended state 578 [1010] if a '0' bit is received, or transition 562 to state 580 [011] if a '1' bit is received. State 528 [110] takes transition 564 to state 582 [100] if a '0' bit is received, or transition 566 to extended state 586 if a '1' bit is received. State 530 [111] takes transition 568 to state 590 [110] if a '0' bit is received, or transition 570 to state 592 [111] if a '1' bit is received.

The data detector calculates branch metric probabilities for each of the transitions 504 in any suitable manner, such as, but not limited to, using a Viterbi algorithm or maximum a posteriori algorithm. From the branch metric probabilities, the data detector can generate a soft output giving the likelihood of each different value for bits of the input data and a hard decision output giving the most likely values for each bit.

In the example embodiment of FIG. 5, if the input data to the detector is encoded with MTR-3 encoding, limiting encoded data to a maximum of three transitions in a row, error-free input data will not include a run of four transitions in a row. However, an 8-state detector having only 3-bit states in the trellis will not be able to identify a run of four transitions in a row. For example, a data pattern of [010] at time k transitioning to a data pattern of [101] at time k+1 identifies only a run of three transitions in a row, from '0' to '1', from '1' to '0' at time k, followed by a third transition from '0' to '1' at time k+1.

In the data detector with extended states, the transition-only state 512 [010], in which each successive bit has a different value from the neighboring bits in the state, is extended with at least one more bit to form extended state 514 [0010] and extended state 516 [1010]. Similarly, transition-only state 522 [101] is extended with at least one more bit to form extended state 524 and extended state 526 [1101]. Stated in generic terms, the extended states 514, 516, 524, 526 include bits Edcb, where bit E is the extended (and oldest) bit in the group. Transitions 540, 542, 544, 546, 556, 558, 560, 562 from extended states 514, 516, 524, 526 represent bits Edcba, a sequence of five bits, in which transition runs of four successive transitions can be detected and pruned from the trellis.

Transition 546 from state 516 [1010] to state 584 [0101] represents the five-bit pattern '10101', a run of four transitions, which is prohibited from occurring in error-free input data by the MTR-3 constraint applied by the upstream encoder. Transition 556 from state 524 [0101] to state 578 [1010] represents the five-bit pattern '01010', another run of four transitions, which is also prohibited from occurring in error-free input data by the MTR-3 constraint applied by the upstream encoder. These two transitions 546, 556 can be pruned from the trellis by the detector, eliminating two prohibited paths. This reduces the chance of errors in the detected values and speeds the overall detection process. The pruning of prohibited paths can be performed in any suitable manner in the detector. In some embodiments, the detector forces the branch metric probabilities to a probability of 0 for the prohibited transitions.

The extended states thus increases the number of states in the trellis to enable functions such as, but not limited to, pruning based on MTR constraints. However, the number of states in the trellis remains lower than if all the states in the trellis included the greater number of bits. For example, the trellis 500 of FIG. 5 corresponds to a 10-state detector but supports pruning based on MTR-3 constraints. Without the extended states, a 16-state detector would be needed to support pruning based on MTR-3 constraints. The 10-state detector with extended states uses less complex states in basic states 508, 510, 518, 520, 528, 530 than a 16-state detector while achieving the performance of the 16-state detector. In some embodiments, the extended states can be merged on the fly for time varying constraints to save power. In such an embodiment, extended states 514, 516 would be merged to a single three-bit state 512 [010] and extended states 524, 526 would be merged to a single three-bit state 522, dynamically converting the 10-state detector to an 8-state detector.

The number of bits in the basic states and extended states is not limited to the 3-bit basic states and 4-bit extended states shown in the embodiment of FIG. 5. For example, a 4-state detector can be extended to a 6-state detector to enable MTR-2 pruning. A 16-state detector can be extended to an 18-state detector to enable MTR-4 pruning. A 32-state detector can be extended to a 34-state detector to enable MTR-5 pruning. The number of extended bits is also not limited to the single extended bit shown in the embodiment of FIG. 5, but can include any number of extended bits. For example, to enable MTR-5 pruning in a 16-state detector, state can be extended to states [00101], [110101] and [010101], and state [1010] extended to states [11010], [001010] and [101010], with states [010101] and [101010] being pruned out.

The constraint checking enabled by extended states in the data detector is not limited to maximum transition runs, but can be applied to any type of constraint. In some embodiments, the data detector with extended states supports detection of k-constraint violations. For example, if a k-constraint limits same bit-runs to four successive bits of the same value, allowing [0000] and [1111] but prohibiting [00000] and [11111], an 8-state detector can be extended to a 10-state detector to provide detection and pruning of transitions corresponding to [00000] and [11111] data patterns in the input data.

Figure 6:
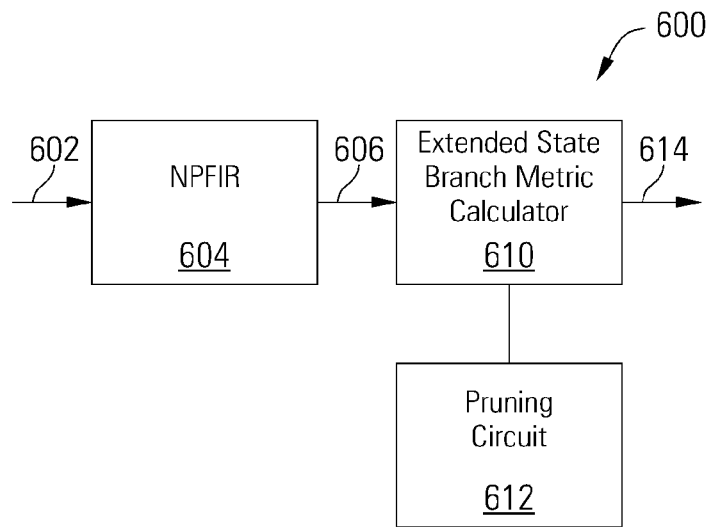
FIG. 6 is a block diagram of a data detector with extended states in accordance with various embodiments of the present invention.

Turning to FIG. 6, a data detector 600 with extended states is depicted in block diagram form in accordance with various embodiments of the present invention. Input data 602 is passed to a noise-predictive finite impulse response (NPFIR) filter 604, which filters the input data 602 to yield filtered data 606. In some embodiments, the number of taps in the NPFIR filter 604 is adjusted based on the number of bits in the trellis states, increasing the number of taps when filtering data for use in extended states. The filtered data 606 is provided to a branch metric calculator 610 which calculates the branch metric probabilities for each of the transitions in the trellis, including transitions from extended states and from less complex basic states. A pruning circuit 612 prunes prohibited transitions for data patterns prohibited by constraints applied to the input data to the detector, for example by forcing branch metric probabilities for prohibited transitions to a probability of 0. The output 614 from the detector can include either or both soft information or hard decisions.

Figure 7:
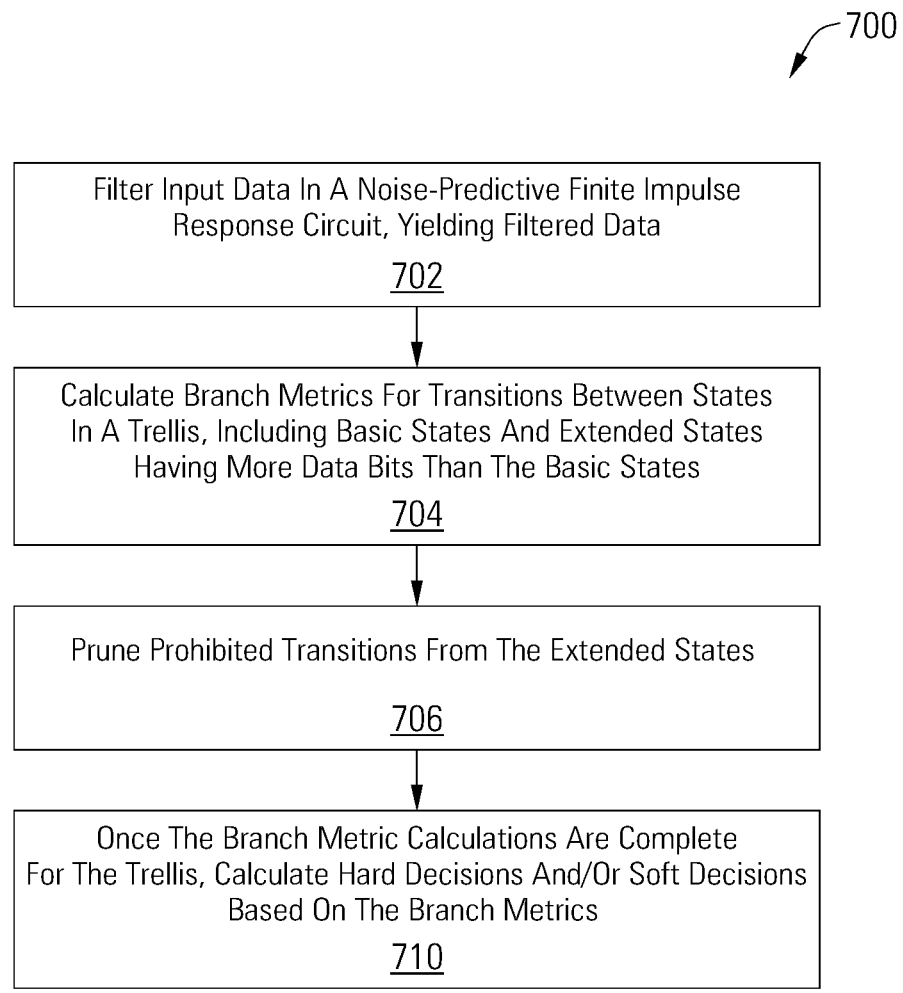
FIG. 7 is a flow diagram of an operation for detecting data values using extended states in accordance with one or more embodiments of the present invention.

Turning to FIG. 7, a flow diagram 700 shows a method for detecting data values using extended states in accordance with one or more embodiments of the present invention. Following flow diagram 700, input data is filtered in a noise-predictive finite impulse response circuit, yielding filtered data. (Block 702) Branch metrics are calculated for transitions between states in a trellis, including basic states and extended states having more data bits than the basic states. (Block 704) Prohibited transitions from the extended states are pruned. (Block 706) Once the branch metric calculations are complete for the trellis, hard decisions are calculated based on the branch metrics. (Block 710)

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be partially implemented in either software or firmware. In some such cases, one part of a given system, block or circuit may be implemented in software or firmware, while other parts are implemented in hardware.

In conclusion, the present invention provides novel systems, devices, methods and arrangements for data detection using a data detector with extended states. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data detector comprising:
   a branch metric calculator operable to calculate branch metrics for transitions between states in a trellis for the data detector, wherein the states in the trellis comprise basic states and extended states, wherein the extended states have a greater number of bits than the basic states; and
   a pruning circuit operable to prune prohibited state transitions from the trellis.

2. The data detector of claim 1, further comprising a noise-predictive finite impulse response filter, wherein a number of taps in the noise-predictive finite impulse response filter is different for data in the basic states than for data in the extended states.

3. The data detector of claim 1, wherein the data detector comprises a soft output Viterbi algorithm detector.

4. The data detector of claim 1, wherein input data to the data detector is encoded with a constraint, and wherein transitions between the basic states do not represent enough bits to detect violations of the constraint, and wherein transitions from extended states do represent enough bits to detect violations of the constraint.

5. The data detector of claim 4, wherein the constraint comprises a maximum transition run constraint.

6. The data detector of claim 4, wherein the constraint comprises a k constraint limiting a number of same valued bits in succession.

7. The data detector of claim 1, wherein those of the basic states which potentially represent bit patterns that violate input data constraints are each divided into a plurality of the extended states by adding at least one extra bit.

8. The data detector of claim 1, wherein the branch metric calculator and the pruning circuit are operable to dynamically merge the extended states into their corresponding basic states.

9. The data detector of claim 1, wherein the data detector comprises a 10-state detector comprising six 3-bit basic states and four 4-bit extended states.

10. The data detector of claim 1, wherein the basic states each represent a different state of a group of N data bits, and wherein the extended states each represent a different state of a group of N+1 data bits.

11. The data detector of claim 1, wherein the extended states enable pruning in the pruning circuit of prohibited patterns of data bits that are longer than can be represented by the basic states.

12. A storage device comprising:
   the data detector of claim 1.

13. A data transmission device comprising:
   the data detector of claim 1.

14. A method for detecting values of data comprising:
   calculating, by a data detector circuit, branch metrics for transitions between states in a trellis, wherein the states comprise basic states and extended states, and wherein the extended states represent a greater number of data bits than the basic states;
   pruning prohibited transitions from the extended states; and
   calculating hard decisions based on the branch metrics.

15. The method of claim 14, wherein input data to the data detector circuit is constrained to prohibit at least one data pattern by a constraint, and wherein the prohibited transitions correspond to the at least one data pattern prohibited by the constraint.

16. The method of claim 15, wherein transitions from the extended states represent enough data bits to identify a violation of the constraint, and transitions from the basic states do not represent enough data bits to identify a violation of the constraint.

17. The method of claim 14, further comprising encoding data according to at least one constraint, yielding constrained encoded data, wherein the data detector circuit receives as input the constrained encoded data.

18. The method of claim 14, further comprising filtering input data in the data detector circuit in a noise predictive finite impulse response filter.

19. The method of claim 14, further comprising merging the extended states dynamically to form additional basic states.

20. A data detector comprising:
   a noise predictive filter operable to filter constrained input data to the data detector to yield filtered data;
   first circuitry operable to calculate probabilities between states in a trellis, wherein the states comprise both basic states and extended states, wherein transitions from the extended states represent enough bits of the filtered data to identify constraint violations, and wherein transitions from the basic states do not represent enough bits of the filtered data to identify the constraint violations; and second circuitry operable to prune the transitions from the extended states corresponding to the constraint violations.

\* \* \* \* \*